United States Patent
Chuang

(10) Patent No.: US 10,385,914 B2
(45) Date of Patent: Aug. 20, 2019

(54) DUAL-SHAFT HINGE WITH THE TWO PIVOT SHAFTS THEREOF DESIGNED TO ROTATE IN TURN

(71) Applicant: DEDA METAL CO., LTD., New Taipei (TW)

(72) Inventor: Kun-You Chuang, New Taipei (TW)

(73) Assignee: DEDA METAL CO., LTD., New Taipei (TW)

( * ) Notice: Subject to any disclaimer, the term of this patent is extended or adjusted under 35 U.S.C. 154(b) by 0 days.

(21) Appl. No.: 16/110,852

(22) Filed: Aug. 23, 2018

(65) Prior Publication Data
US 2018/0363695 A1    Dec. 20, 2018

(51) Int. Cl.
| | |
|---|---|
| *E05D 3/06* | (2006.01) |
| *F16C 11/04* | (2006.01) |
| *E05D 11/08* | (2006.01) |
| *G06F 1/16* | (2006.01) |
| *H04M 1/02* | (2006.01) |
| *H05K 5/02* | (2006.01) |
| *E05D 11/10* | (2006.01) |
| *E05F 1/00* | (2006.01) |
| *E05D 3/12* | (2006.01) |

(52) U.S. Cl.
CPC ................ *F16C 11/04* (2013.01); *E05D 3/06* (2013.01); *E05D 11/082* (2013.01); *G06F 1/1681* (2013.01); *H04M 1/02* (2013.01); *H04M 1/0216* (2013.01); *H05K 5/02* (2013.01); *E05D 3/12* (2013.01); *E05D 11/10* (2013.01); *E05F 1/00* (2013.01); *E05Y 2900/606* (2013.01); *H05K 5/0226* (2013.01); *Y10T 16/547* (2015.01)

(58) Field of Classification Search
CPC .... E05D 3/12; E05D 3/06; E05D 3/10; G06F 1/1681; G06F 1/1616; G06F 1/1618; E05Y 2900/606; H04M 1/0216; H04M 1/0222; H04M 1/022; F16C 11/04; F16C 11/10; F16C 11/12; Y10T 16/54038; Y10T 16/5403; Y10T 16/54033; Y10T 16/547; Y10T 16/5474; Y10T 16/5475
See application file for complete search history.

(56) References Cited

U.S. PATENT DOCUMENTS

| | | | | |
|---|---|---|---|---|
| 7,484,269 | B2* | 2/2009 | Chih ..................... | F16M 11/10 16/340 |
| 8,776,319 | B1* | 7/2014 | Chang .................. | G06F 1/1681 16/303 |
| 9,003,606 | B2* | 4/2015 | Hsu ....................... | G06F 1/1681 16/366 |
| 9,009,919 | B1* | 4/2015 | Chiang ................. | G06F 1/1681 16/303 |
| 9,103,147 | B1* | 8/2015 | Chuang ................ | G06F 1/1681 |
| 9,261,900 | B2* | 2/2016 | Hsu .......................... | G06F 1/16 |
| 9,265,167 | B2* | 2/2016 | Hsu ......................... | H04M 1/022 |
| 9,290,976 | B1* | 3/2016 | Horng .................. | G06F 1/1618 |
| 9,600,036 | B2* | 3/2017 | Uchiyama ............ | G06F 1/1618 |
| 2009/0000062 | A1* | 1/2009 | Yamanami ........... | G06F 1/1616 16/366 |

(Continued)

*Primary Examiner* — Chuck Y Mah

(57) ABSTRACT

A dual-shaft hinge includes a hinge body, a pivot shaft set including a first pivot shaft and a second pivot shaft and pivotally mounted in the hinge body in parallel, and a rotation constraint unit mounted in the hinge body and so configured for allowing the first pivot shaft and the second pivot shaft to be rotated in turn.

6 Claims, 15 Drawing Sheets

(56) References Cited

U.S. PATENT DOCUMENTS

| | | | | |
|---|---|---|---|---|
| 2012/0192381 A1* | 8/2012 | Zhang | ............... | G06F 1/1681 16/366 |
| 2013/0318746 A1* | 12/2013 | Kuramochi | ......... | G06F 1/1681 16/342 |
| 2015/0020351 A1* | 1/2015 | Lin | ..................... | E05D 11/06 16/366 |
| 2015/0052707 A1* | 2/2015 | Lin | ..................... | G06F 1/1618 16/366 |
| 2015/0160695 A1* | 6/2015 | Su | ..................... | G06F 1/1618 16/366 |
| 2015/0173218 A1* | 6/2015 | Hsu | ..................... | E05D 3/12 16/366 |
| 2015/0189777 A1* | 7/2015 | Hsu | ..................... | H05K 5/0226 16/366 |
| 2015/0245510 A1* | 8/2015 | Hsu | ..................... | H05K 5/0226 16/250 |

\* cited by examiner

US 10,385,914 B2

DUAL-SHAFT HINGE WITH THE TWO PIVOT SHAFTS THEREOF DESIGNED TO ROTATE IN TURN

BACKGROUND OF THE INVENTION

1. Field of the Invention

The present invention relates to hinge technology and more particularly, to a dual-shaft hinge, which uses a rotation constraint unit to control rotation and positioning of two pivot shafts, enabling the two pivot shafts to be rotated in turn so that the dual-shaft hinge is not easy to lose efficacy or get stuck because of wear.

2. Description of the Related Art

A dual-leaf mobile electronic device uses a dual-shaft hinge for allowing a top cover a bottom cover to be closed and opened. A dual-shaft hinge generally comprises an axle housing that comprises a first coupling portion at one end, a second coupling portion at an opposite end, a first notch at one end of the first coupling portion and a second notch at one end of the second coupling portion, a first pivot shaft pivotally coupled to the first coupling portion, and a second pivot shaft pivotally coupled to the second coupling portion. When the user biases the top cover relative to the bottom cover, the first pivot shaft and the second pivot shaft are driven to rotate one after the other. This design of dual-shaft hinge allows the user to open the top cover from the bottom cover with less effort. When closing the top cover on the bottom cover, the user needs to apply more effort. As the first pivot shaft and the second pivot shaft are designed to rotate one after another, the first coupling portion and the second coupling portion can wear out through long use. When the first and second coupling portions start to wear, the rotation sequence of the first and second pivot shafts will not be ensured, affecting the positioning accuracy and biasing stability of the top cover relative to the bottom cover.

SUMMARY OF THE INVENTION

The present invention has been accomplished under the circumstances in view. It is therefore the main object of the present invention to provide a dual-shaft hinge, which uses a constraint block of a rotation constraint unit between first and second pivot shafts of a pivot shaft set and movable position-limiting rods in the constraint block for enabling the first and second pivot shafts to be rotated in turn so that the dual-shaft hinge is not easy to lose efficacy or get stuck because of wear.

To achieve this and other objects of the present invention, a dual-shaft hinge comprises a hinge body, a pivot shaft set and a rotation constraint unit. The pivot shaft set comprises a first pivot shaft and a second pivot shaft arranged in parallel and pivotally connected to the hinge body. The first pivot shaft comprises a first shaft body, and a plurality of first grooves located on the first shaft body. The second pivot shaft comprises a second shaft body, and a plurality of second grooves located on the second shaft body. The rotation constraint unit comprises a constraint block abutted between the first shaft body and second shaft body of the pivot shaft set, and a plurality of position-limiting rods inserted through the constraint block. Each position-limiting rod comprises a first position-limiting segment located at one end thereof and aimed at one respective first groove of the pivot shaft set, and a second position-limiting segment located at an opposite end thereof and aimed at one respective second groove of the pivot shaft set When the first position-limiting segments of the position-limiting rods enter the respective first grooves of the first pivot shaft, the second position-limiting segments are disposed in contact with the periphery of the second shaft body of the second pivot shaft allowing rotation of the second pivot shaft and prohibiting the first pivot shaft from rotation. When the second position-limiting segments of the position-limiting rods enter the respective second grooves of the second pivot shaft, the first position-limiting segments are disposed in contact with the periphery of the first pivot shaft body of the first pivot shaft, allowing rotation of the first pivot shaft and prohibiting the second pivot shaft from rotation.

DETAILED DESCRIPTION OF THE PREFERRED EMBODIMENT

Figure 1:
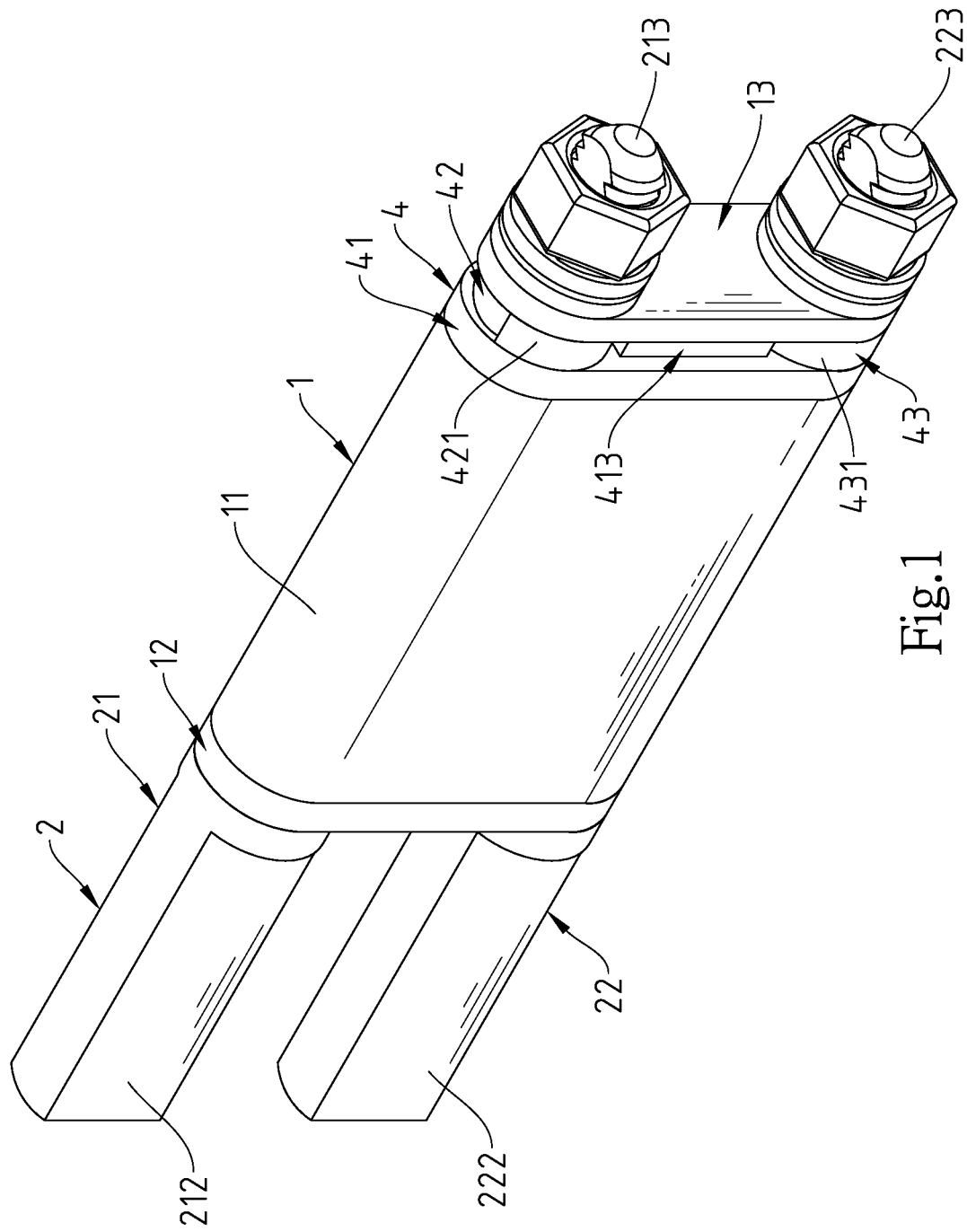
FIG. 1 is an elevational view of a dual-shaft hinge in accordance with the present invention.
Figure 2:
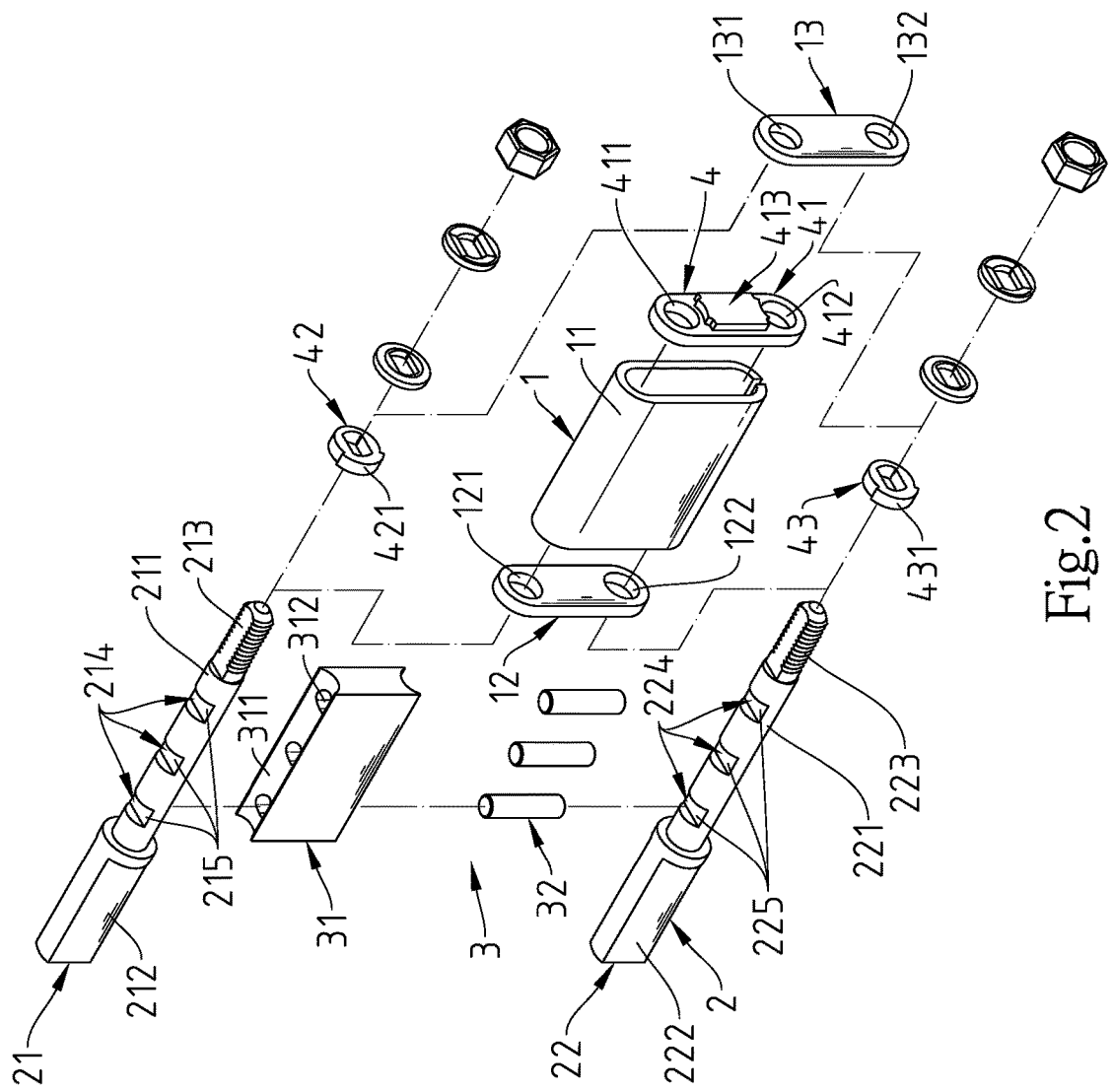
FIG. 2 is an exploded view of the dual-shaft hinge in accordance with the present invention.
Figure 3:
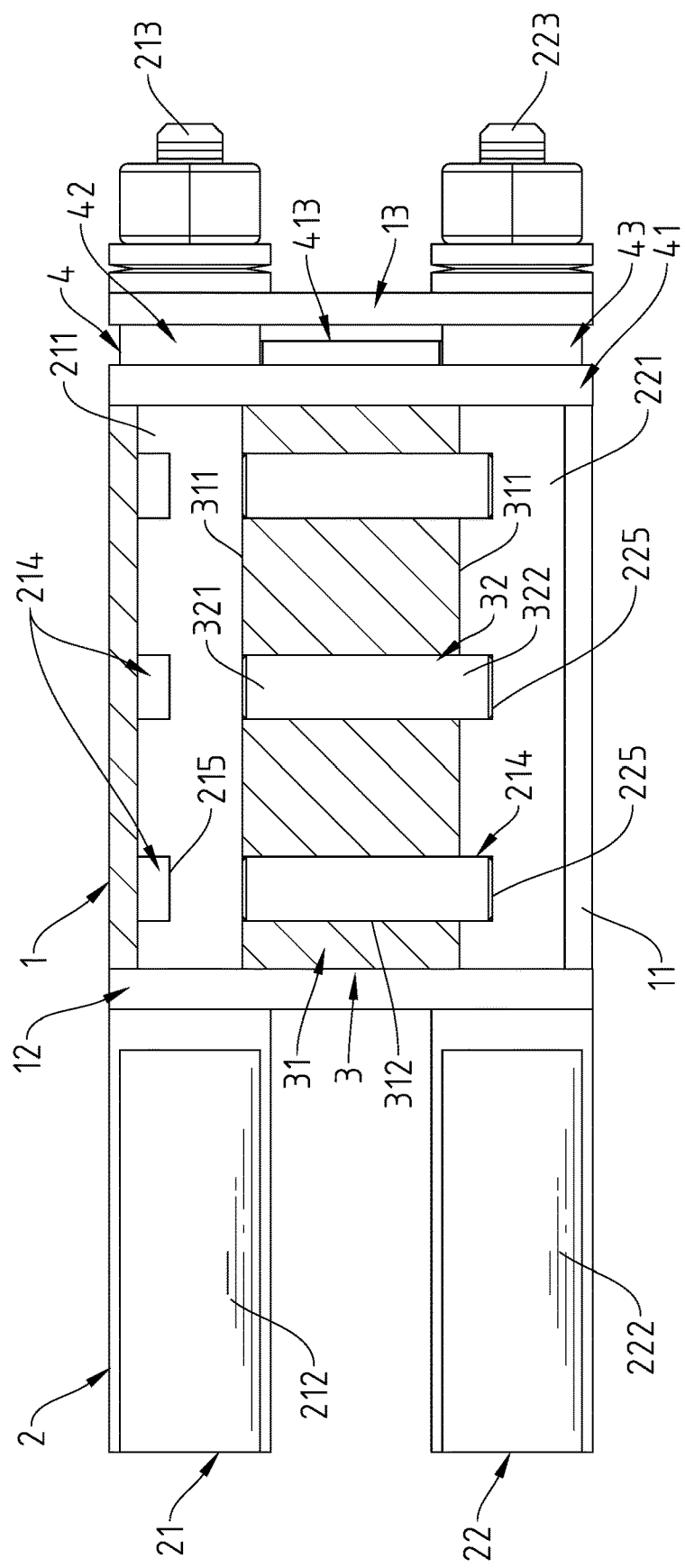
FIG. 3 is a sectional view of the dual-shaft hinge in accordance with the present invention.

Referring to FIGS. 1-3, a dual-shaft hinge in accordance with the present invention is shown. The dual-shaft hinge comprises a hinge body 1, a pivot shaft set 2, a rotation constraint unit 3 and a brake unit 4.

The pivot shaft set 2 comprises a first pivot shaft 21 and a second pivot shaft 22 pivotally connected in parallel to the hinge body 1. The first pivot shaft 21 comprises a first shaft body 211, a first connection portion 212 located at one end of the first shaft body 211, a first positioning portion 213 located at an opposite end of the first shaft body 211, a plurality of first grooves 214 transversely located on the periphery of the first shaft body 211 in a parallel manner, and a first bearing surface 215 located on a bottom side of each first groove 214. The second pivot shaft 22 comprises a second shaft body 221, a second connection portion 222 located at one end of the second shaft body 221, a second positioning portion 223 located at an opposite end of the second shaft body 221, a plurality of second grooves 224 transversely located on the periphery of the second shaft body 221, and a second bearing surface 225 located on a bottom side of each second groove 224.

The rotation constraint unit 3 comprises a constraint block 31 and a plurality of position-limiting rods 32 inserted through the constraint block 31. The constraint block 31 has two opposite ends thereof respectively abutted at the first shaft body 211 and second shaft body 221 of the pivot shaft set 2. Each position-limiting rod 32 comprises a first position-limiting segment 321 located on one end thereof and aimed at one respective first groove 214, and a second position-limiting segment 322 located on an opposite end thereof and aimed at one respective second groove 224.

The constraint block 31 comprises an inwardly arched abutment surface 311 formed on each of the two opposite ends thereof and respectively abutted against the first shaft body 211 and the second shaft body 221, and a plurality of parallel through holes 312 cut through the two inwardly arched abutment surfaces 311. The position-limiting rods 32 are respectively mounted in the through holes 312 with the first position-limiting segments 321 or second position-limiting segments 322 disposed outside the respective through holes 312.

The brake unit 4 comprises a brake member 41, a first cam 42 and a second cam 43. The brake member 41 is mounted in one side of the hinge body 1, comprising a first pivot hole 411 and a second pivot hole 412 respectively located at two opposite ends thereof and respectively pivotally coupled to the first positioning portion 213 of the first pivot shaft 21 and the second positioning portion 223 of the second pivot shaft 22, a stop block 413 located at one side thereof between the first pivot hole 411 and the second pivot hole 412, a first stop edge 4131 and a second stop edge 4132 bilaterally located at one end of the stop block 413 near the first pivot hole 411, and a third stop edge 4133 and a fourth stop edge 4134 bilaterally located at an opposite end of the stop block 413 near the second pivot hole 412. The first cam 42 and the second cam 43 are respectively mounted on the first positioning portion 213 of the first pivot shaft 21 and the second positioning portion 223 of the second pivot shaft 22. Further, the first cam 42 comprises a first protruding portion 421 facing toward the stop block 413. The second cam 43 comprises a second protruding portion 431 facing toward the stop block 413.

In this embodiment, the hinge body 1 comprises an axle housing 11, and a first positioning member 12 and a second positioning member 13 respectively disposed at two opposite sides of the axle housing 11. The second positioning member 13 is disposed between the axle housing 11 and the brake member 41. The first positioning member 12 comprises a first positioning hole 121 and a second positioning hole 12 respectively located at two opposite ends thereof. The second positioning member 13 comprises a third positioning hole 131 and a fourth positioning hole 132 respectively located at two opposite ends thereof. The first positioning hole 121 and the third positioning hole 131 are respectively pivotally coupled to two opposite ends of the first shaft body 211 of the first pivot shaft 21 of the pivot shaft set 2. The second positioning hole 12 and the fourth positioning hole 132 are respectively pivotally coupled to two opposite ends of the second shaft body 221 of the second pivot shaft 22. The constraint block 31 of the rotation constraint unit 3 is mounted in the axle housing 11.

Referring to FIGS. 4-15, in application of the dual-shaft hinge, the first connection portion 212 of the first pivot shaft 21 and the second connection portion 222 of the second pivot shaft 22 are respectively fastened to a top cover 5 and a bottom cover 6.

Figure 4:
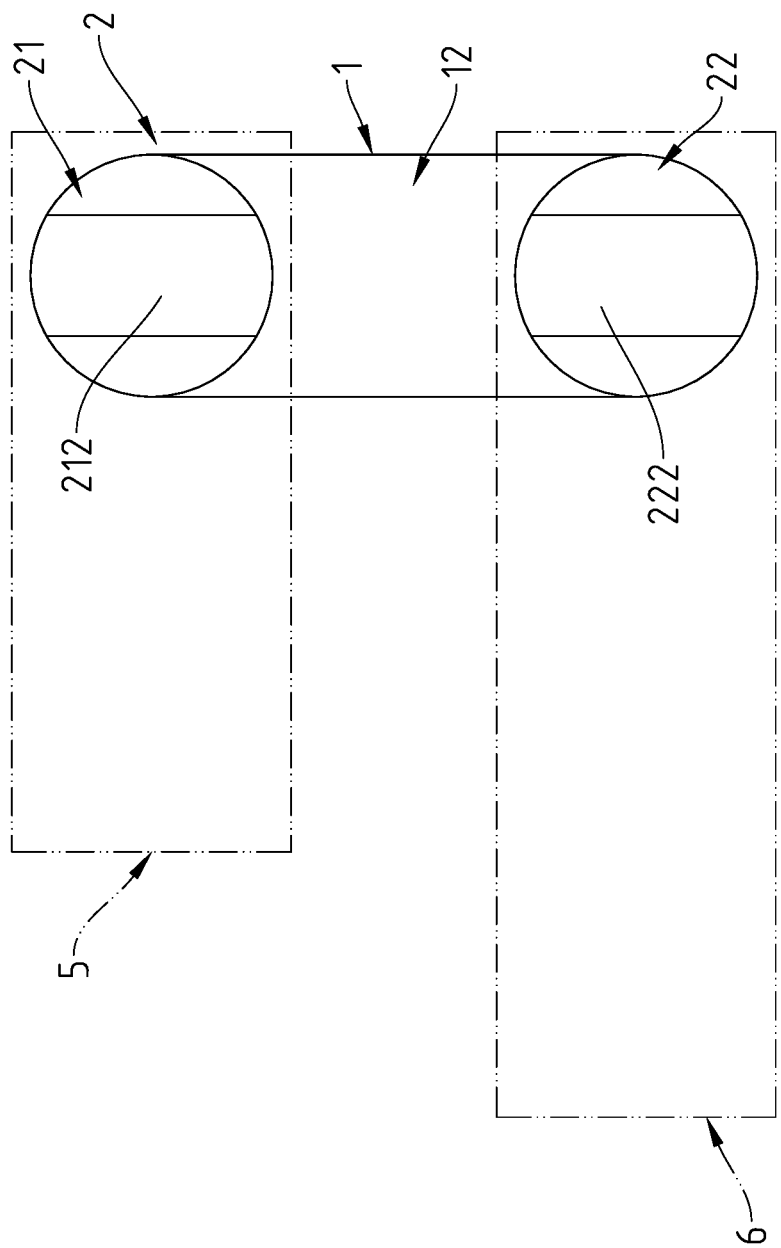
FIG. 4 is a schematic side view illustrating an application status of the dual-shaft hinge where the top cover is disposed in parallel to the top side of the bottom cover.
Figure 5:
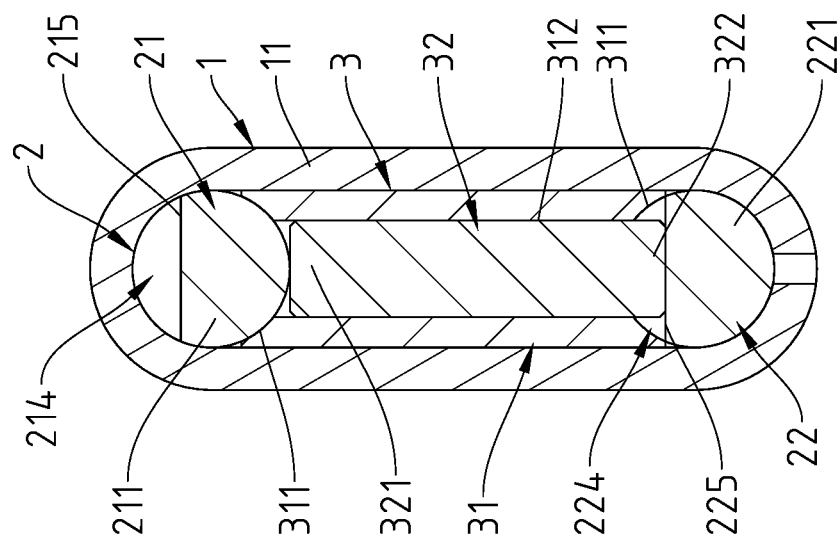
FIG. 5 is a schematic sectional view illustrating the positioning of the component parts of the dual-shaft hinge where the top cover is disposed in parallel to the top side of the bottom cover (I).
Figure 6:
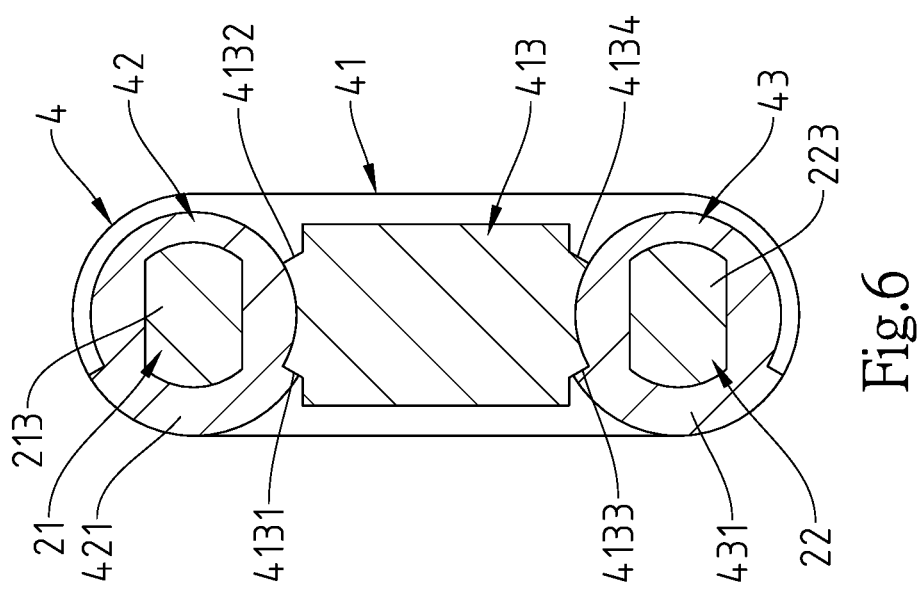
FIG. 6 is a schematic sectional view illustrating the positioning of the component parts of the dual-shaft hinge where the top cover is disposed in parallel to the top side of the bottom cover (II).

When the top cover 5 and the bottom cover 6 are closed and disposed in parallel, as shown in FIGS. 4-6, the second position-limiting segments 322 of the position-limiting rods 32 of the rotation constraint unit 3 enter the respective second grooves 224 of the second pivot shaft 22 and abutted against the respective second bearing surfaces 225 to stop the second pivot shaft 22 from rotation, the first position-limiting segments 321 of the position-limiting rods 32 are disposed in contact with the periphery of the first shaft body 211 of the first pivot shaft 21, the first protruding portion 421 of the first cam 42 of the brake unit 4 is abutted against the first stop edge 4131 of the stop block 413 and the second protruding portion 431 of the second cam 43 is abutted against the third stop edge 4133, thus, the first pivot shaft 21 is rotatable and the second pivot shaft 22 is prohibited from rotation.

Figure 7:
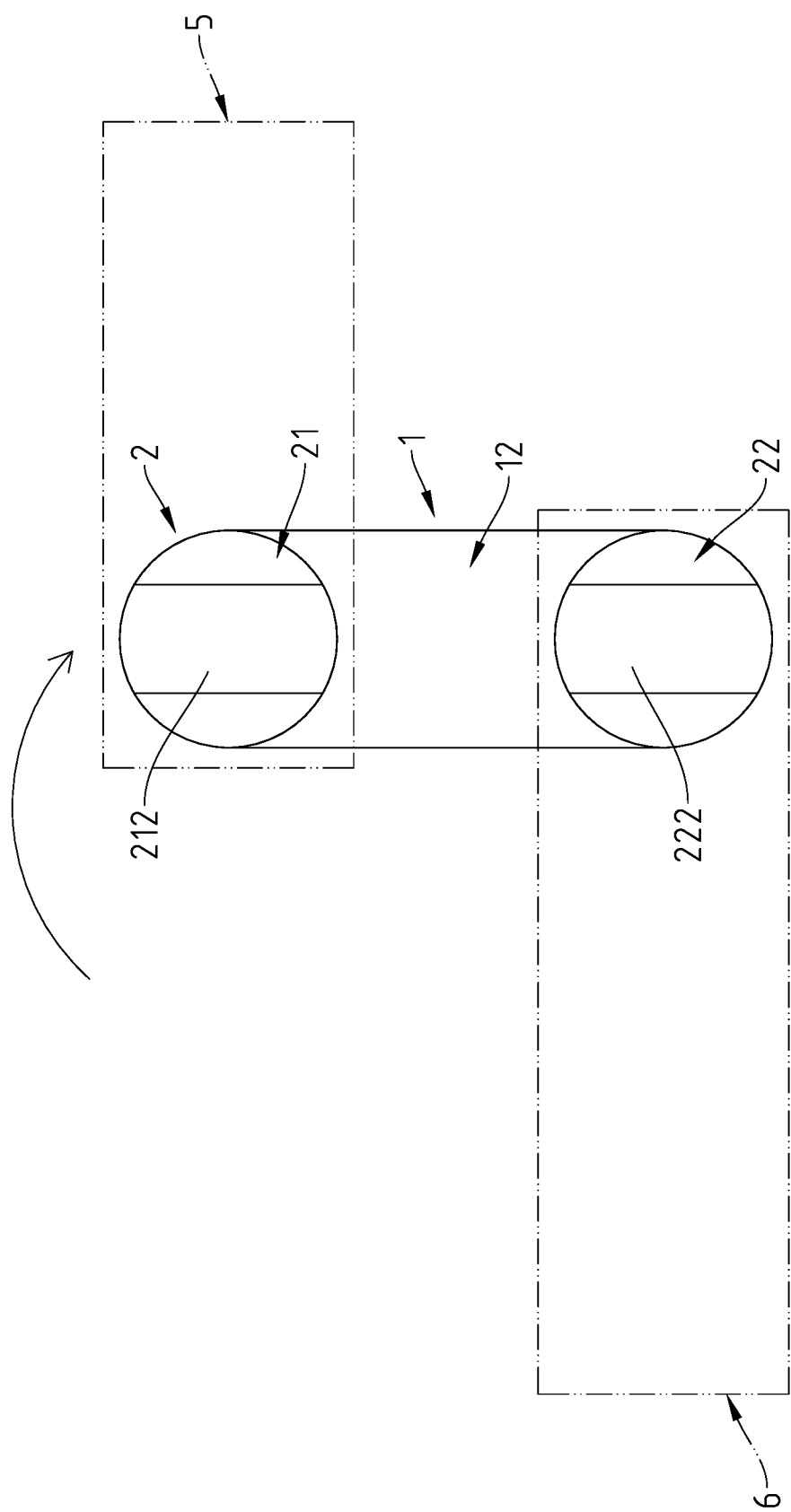
FIG. 7 is a schematic side view illustrating an application status of the dual-shaft hinge where the top cover is disposed at one side of the bottom cover in a parallel manner.
Figure 8:
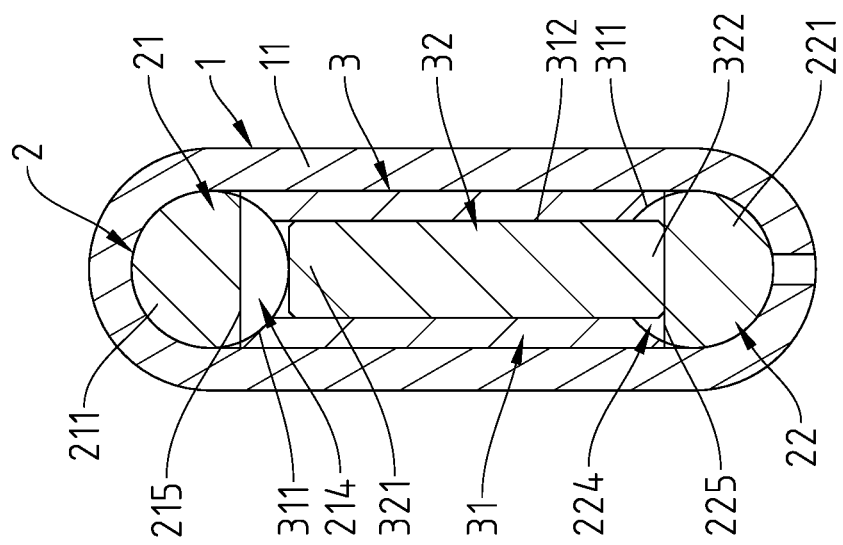
FIG. 8 is a schematic sectional view illustrating the positioning of the component parts of the dual-shaft hinge where the top cover is disposed at one side of the bottom cover in a parallel manner (I).
Figure 9:
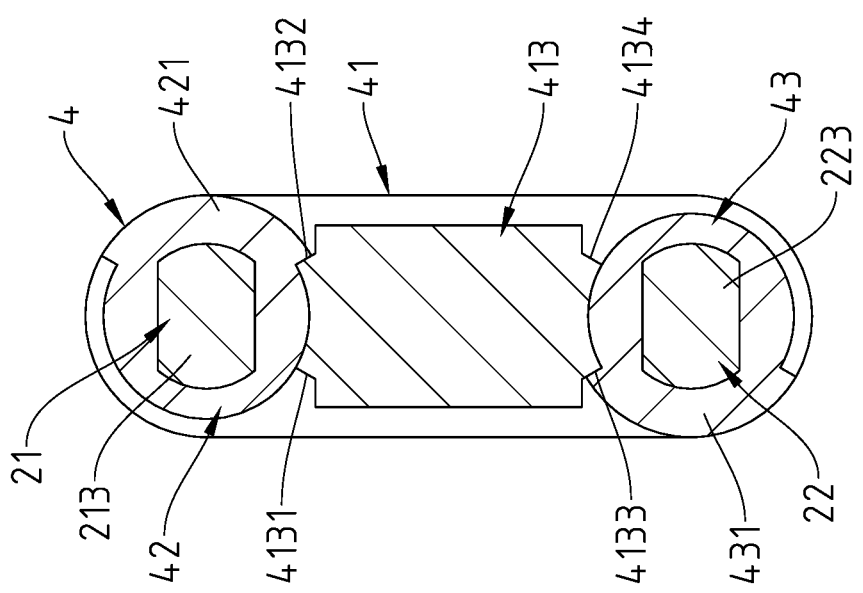
FIG. 9 is a schematic sectional view illustrating the positioning of the component parts of the dual-shaft hinge where the top cover is disposed at one side of the bottom cover in a parallel manner (II).

When the user bias the top cover 5 toward the bottom side of the bottom cover 6 to keep the top cover 5 in parallel to the bottom cover 6, as shown in FIGS. 7-9, the first pivot shaft 21 of the pivot shaft set 2 is biased with the top cover 5 to move the first grooves 214 into alignment with the first position-limiting segments 321 of the position-limiting rod 32, causing movement of the first protruding portion 421 of the first cam 42 of the brake unit 4 away from the first stop edge 4131 of the stop block 413 toward and into abutment against the second stop edge 4132. At this time, the second pivot shaft 22 is in an unrotated state.

Figure 10:
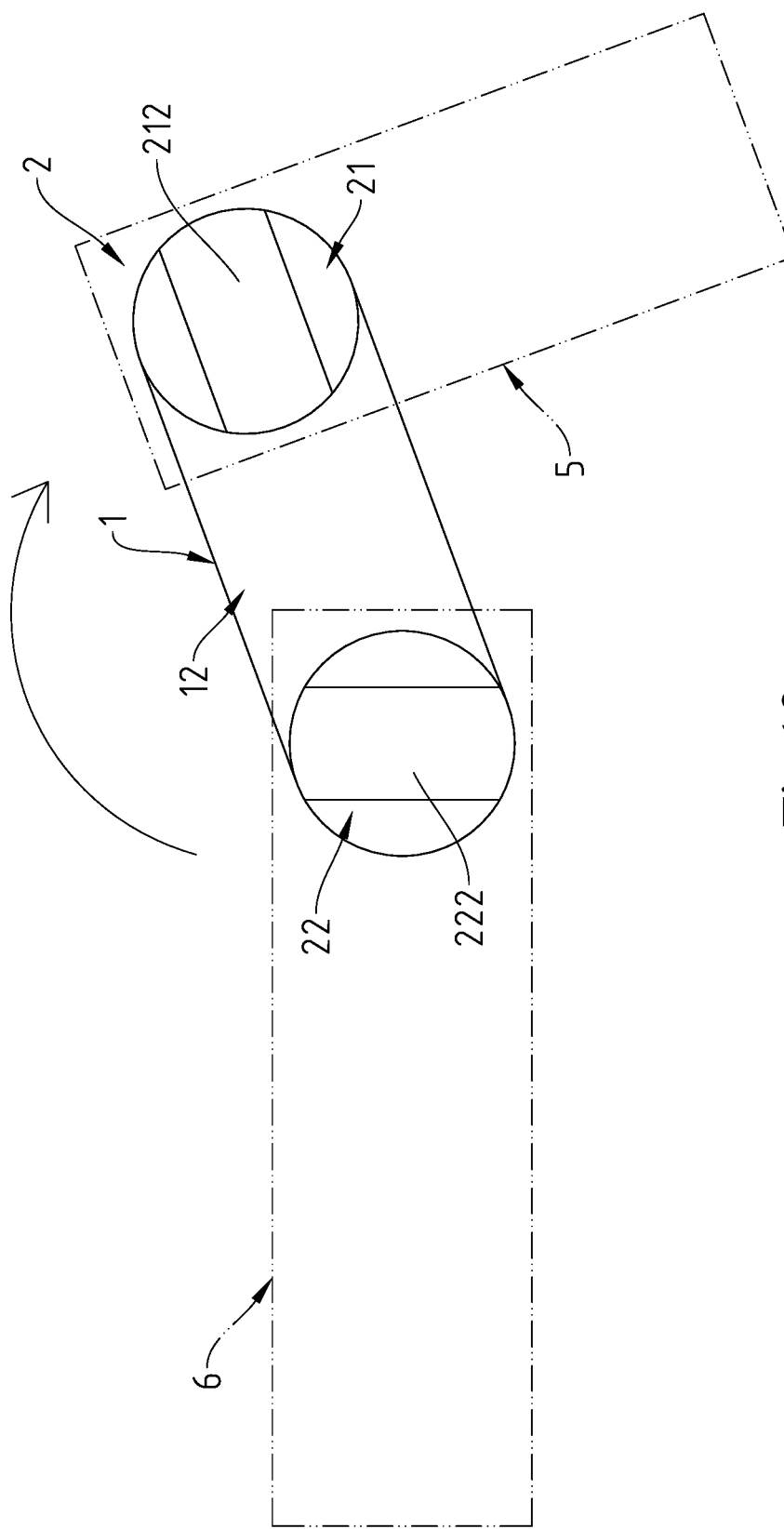
FIG. 10 is a schematic side view illustrating the top cover biased toward the bottom side of the bottom cover.
Figure 11:
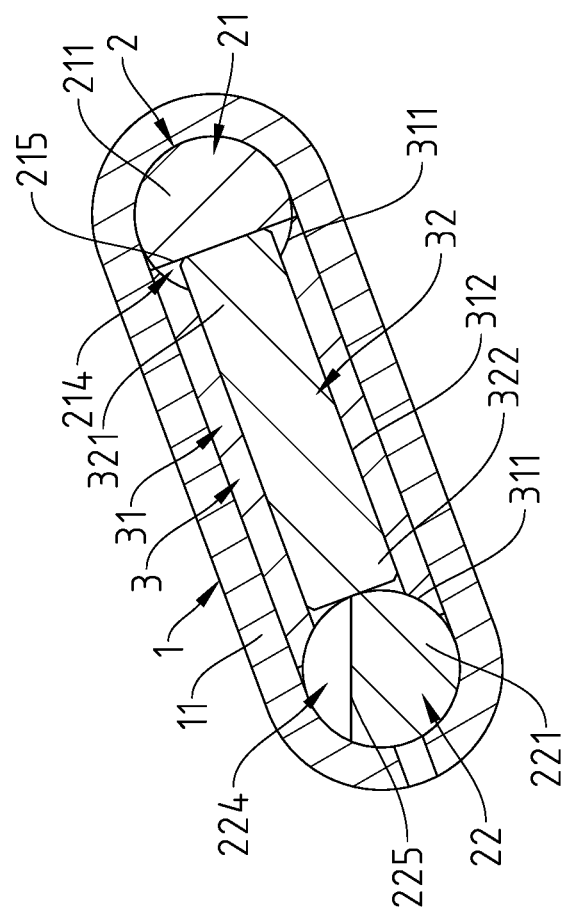
FIG. 11 is a schematic sectional view illustrating the positioning of the component parts of the dual-shaft hinge where the top cover is biased toward the bottom cover in a parallel manner (I).
Figure 12:
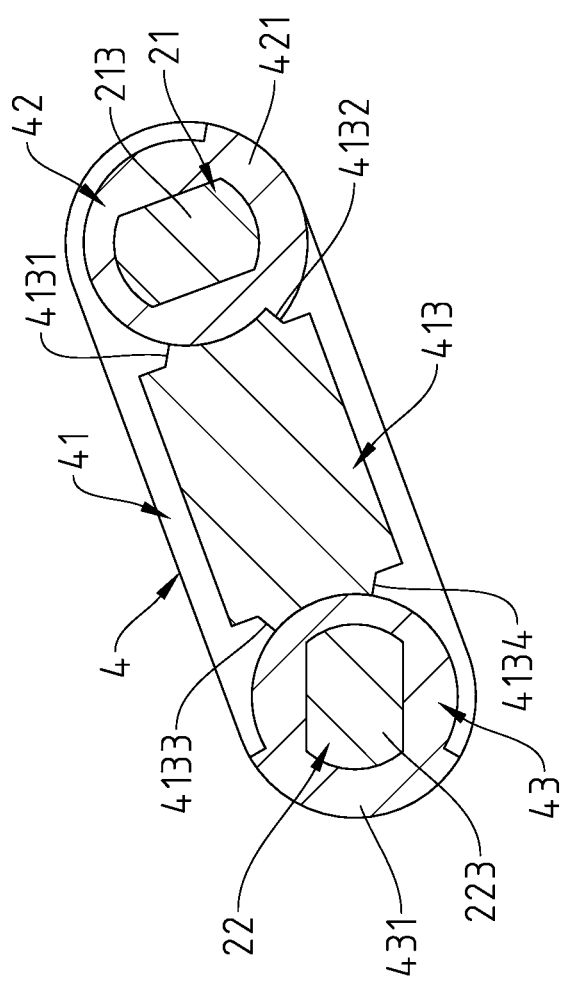
FIG. 12 is a schematic sectional view illustrating the positioning of the component parts of the dual-shaft hinge where the top cover is biased toward the bottom cover in a parallel manner (II).

When the user keeps biasing the top cover 5 toward the bottom side of the bottom cover 6, as shown in FIGS. 10-12, the axle housing 11 of the hinge body 1 drives the constraint block 31 to rotate on the second pivot shaft 22 toward the bottom side of the bottom cover 6, moving the third stop edge 4133 of the stop block 413 of the brake member 41 away from the second protruding portion 431 to gradually reduce the gap between the fourth stop edge 4134 and the second protruding portion 431, at the same time, the second position-limiting segments 322 of the position-limiting rods 32 are moved away from the respective second bearing surfaces 225 of the second pivot shaft 22 into contact with the periphery of the second shaft body 221 according to the turning direction of the top cover 5, and thus, the first position-limiting segments 321 of the position-limiting rods 32 are moved toward the respective first grooves 214 of the first pivot shaft 21.

Figure 13:
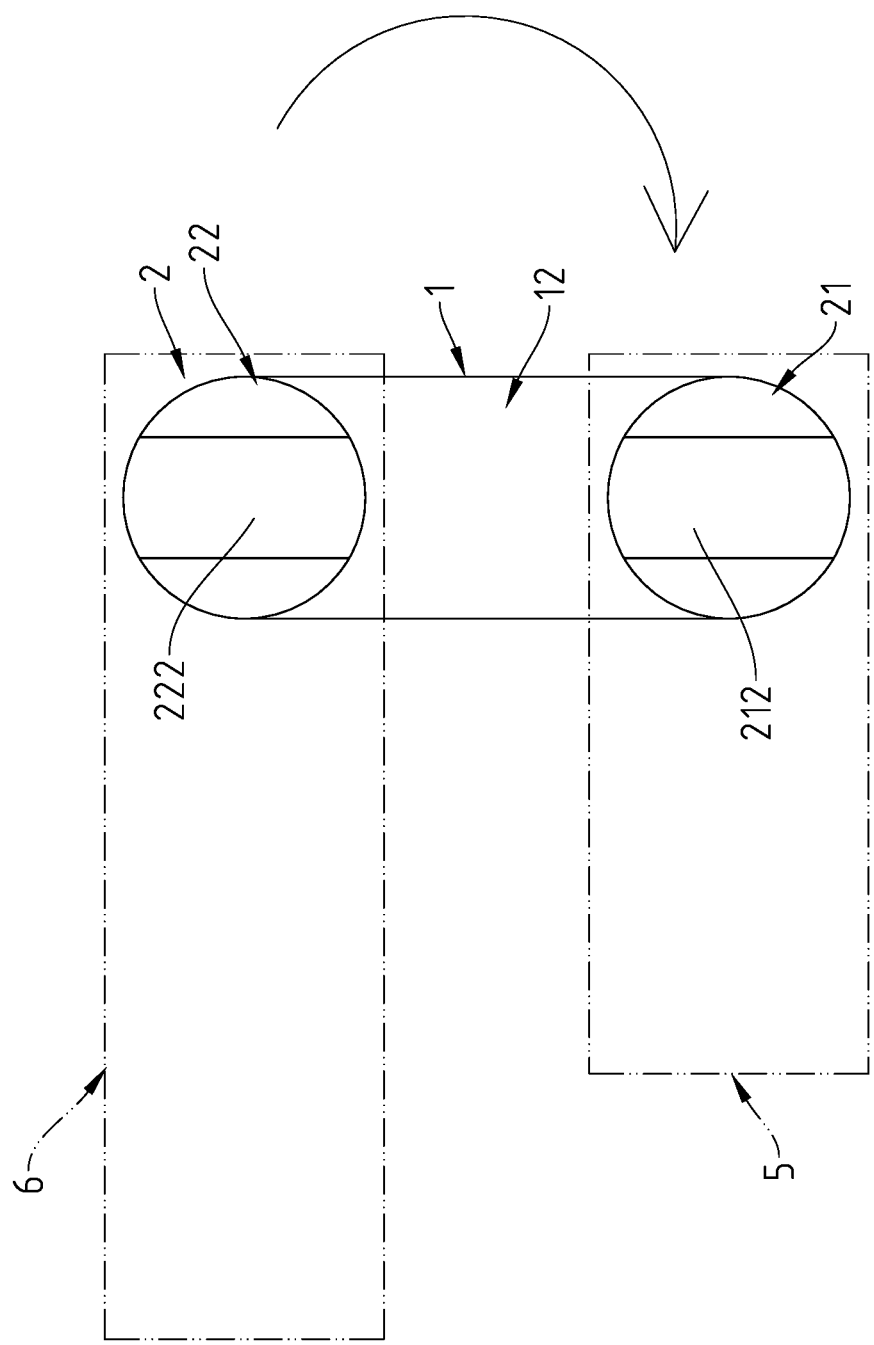
FIG. 13 is a schematic side view illustrating the top cover disposed in parallel to the bottom side of the bottom cover.
Figure 14:
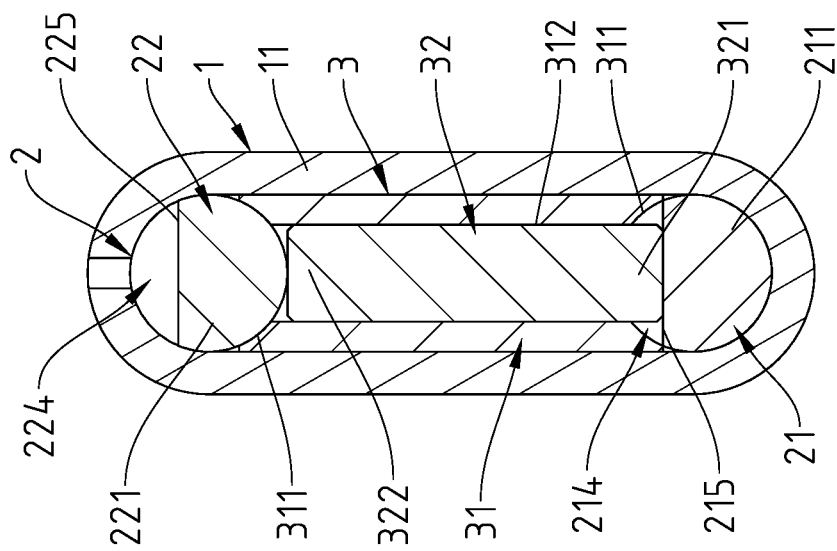
FIG. 14 is a schematic sectional view illustrating the positioning of the component parts of the dual-shaft hinge where the top cover is disposed in parallel to the bottom cover in a parallel manner (I).
Figure 15:
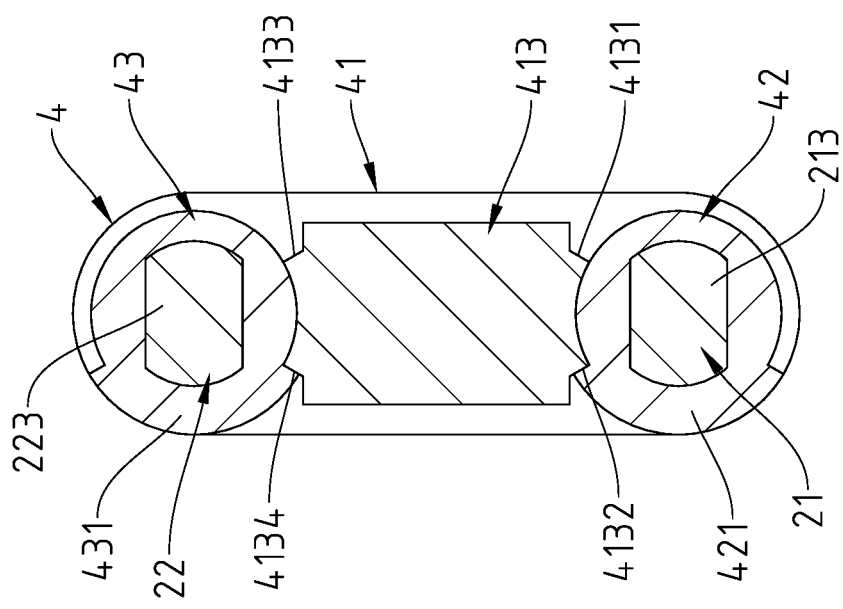
FIG. 15 is a schematic sectional view illustrating the positioning of the component parts of the dual-shaft hinge where the top cover is disposed in parallel to the bottom cover in a parallel manner (II).

When the top cover 5 is attached to the bottom side of the bottom cover 6 and disposed in parallel, as shown in FIGS. 13-15, the first position-limiting segments 321 of the position-limiting rods 32 of the rotation constraint unit 3 enter the respective first grooves 214 of the first pivot shaft 21 and abutted against the respective first bearing surfaces 215 to stop the first pivot shaft 21 from rotation, the second position-limiting segments 322 are disposed in contact with the periphery of the second shaft body 221 of the second pivot shaft 22, the second protruding portion 431 of the second cam 43 of the brake unit 4 is abutted against the fourth stop edge 4134 of the stop block 413, the first protruding portion 421 of the first cam 42 of the brake unit 4 is abutted against the second stop edge 4132, allowing rotation of the second pivot shaft 22 and prohibiting the first pivot shaft 21 from rotation, and thus, the top cover 5 is positively held at the bottom side of the bottom cover 6.

Thus, when the second position-limiting segments 322 of the position-limiting rods 32 are abutted against the respective second bearing surfaces 225 of the second pivot shaft 22, the second pivot shaft 22 is prohibited from rotation, at this time, the first pivot shaft 21 is rotated to the extent where the first protruding portion 421 of the first cam 42 is abutted against the second stop edge 4132, allowing the top cover 5 to be biased to one side of the bottom cover 6; when the first position-limiting segments 321 of the position-limiting rods 32 are abutted against the respective first bearing surfaces 215 of the first pivot shaft 21, the first pivot shaft 21 is prohibited from rotation, at this time, the hinge body 1 is biasable with the second pivot shaft 22 to the extent where the second protruding portion 431 of the second cam 43 is abutted against the fourth stop edge 4134, allowing the top cover 5 to be biased to the bottom side of the bottom cover 6. Therefore, by means that the first protruding portion 421 is stoppable by the first stop edge 4131 and the second stop edge 4132 of the brake member 41, the rotation range of the first pivot shaft 21 is limited; by means that the second protruding portion 431 is stoppable by the third stop edge 4133 and the fourth stop edge 4134, the rotating range of the second pivot shaft 22 is limited.

What the invention claimed is:

1. A dual-shaft hinge, comprising:
   a hinge body;
   a pivot shaft set comprising a first pivot shaft and a second pivot shaft arranged in parallel and pivotally connected to said hinge body, said first pivot shaft comprising a first shaft body and a plurality of first grooves located on said first shaft body, said second pivot shaft comprising a second shaft body and a plurality of second grooves located on said second shaft body; and
   a rotation constraint unit comprising a constraint block abutted between said first shaft body and said second shaft body of said pivot shaft set and a plurality of position-limiting rods inserted through said constraint block, each said position-limiting rod comprising a first position-limiting segment located at one end thereof and aimed at one respective said first groove of said pivot shaft set and a second position-limiting segment located at an opposite end thereof and aimed at one respective said second groove of said pivot shaft set;
   wherein when said first position-limiting segments of said position-limiting rods enter the respective said first grooves of said first pivot shaft, said second position-limiting segments are disposed in contact with the periphery of said second shaft body of said second pivot shaft, allowing rotation of said second pivot shaft and prohibiting said first pivot shaft from rotation; when said second position-limiting segments of said position-limiting rods enter the respective said second grooves of said second pivot shaft, said first position-limiting segments are disposed in contact with the periphery of said first pivot shaft body of said first pivot shaft, allowing rotation of said first pivot shaft and prohibiting said second pivot shaft from rotation.

2. The dual-shaft hinge as claimed in claim 1, wherein said constraint block of said rotation constraint unit comprises two inwardly arched abutment surfaces respectively located at two opposite ends thereof and respectively abutted against said first shaft body and said second shaft body of said pivot shaft set, a plurality of through holes cut through said two inwardly arched abutment surfaces; said position-limiting rods are respectively and axially slidably mounted in said through holes with the respective said first position-limiting segments or said second position-limiting segments disposed outside the respective said through holes.

3. The dual-shaft hinge as claimed in claim 1, wherein said first pivot shaft of said pivot shaft set further comprises a first bearing surface located on a bottom side of each said first groove; when said first position-limiting segments of said position-limiting rods enter the respective said first grooves of said first pivot shaft, said second position-limiting segments of said position-limiting rods are disposed in contact with the periphery of said second shaft body of said second pivot shaft and said first position-limiting segments of said position-limiting rods are stopped against the respective said first bearing surfaces to prohibit said first pivot shaft from rotation.

4. The dual-shaft hinge as claimed in claim 1, wherein said second pivot shaft of said pivot shaft set further comprises a second bearing surface located on a bottom side of each said second groove; when said second position-limiting segments of said position-limiting rods enter the respective said second grooves of said second pivot shaft, said first position-limiting segments of said position-limiting rods are disposed in contact with the periphery of said first shaft body of said first pivot shaft and said second position-limiting segments of said position-limiting rods are stopped against the respective said second bearing surfaces to prohibit said second pivot shaft from rotation.

5. The dual-shaft hinge as claimed in claim 1, further comprising a brake unit mounted in one side of said hinge body, said brake unit comprising a brake member, a first cam mounted on said first shaft body and a second cam mounted on said second shaft body, said brake member comprising a first pivot hole and a second pivot hole respectively located at two opposite ends thereof and respectively pivotally coupled to said first shaft body of said first pivot shaft and said second shaft body of said pivot shaft of said pivot shaft set and a stop block located at one side thereof between said first pivot hole and said second pivot hole for stopping against said first cam and said second cam to the range of rotation of said first shaft body and said second shaft body.

6. The dual-shaft hinge as claimed in claim 5, wherein said stop block of said brake unit comprises a first stop edge and a second stop edge bilaterally located at one end thereof near said first pivot hole, and a third stop edge and a fourth stop edge bilaterally located at an opposite end thereof near said second pivot hole; said first cam comprises a first protruding portion protruded from one side thereof near said stop block and stoppable by said first stop edge and said second stop edge to limit the range of rotation of said first shaft body; said second cam comprises a second protruding portion protruded from one side thereof near said stop block and stoppable by said third stop edge and said fourth stop edge to limit the range of rotation of said second shaft body.

* * * * *